(12) United States Patent
Eto (10) Patent No.: US 11,229,114 B2
(45) Date of Patent: Jan. 18, 2022

(54) HEAT DISSIPATION STRUCTURE AND HEAT DISSIPATION METHOD

(71) Applicant: NEC Platforms, Ltd., Kawasaki (JP)

(72) Inventor: Jun Eto, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 0 days.

(21) Appl. No.: 16/960,739

(22) PCT Filed: Dec. 12, 2018

(86) PCT No.: PCT/JP2018/045600
§ 371 (c)(1),
(2) Date: Jul. 8, 2020

(87) PCT Pub. No.: WO2019/138762
PCT Pub. Date: Jul. 18, 2019

(65) Prior Publication Data
US 2020/0359525 A1    Nov. 12, 2020

(30) Foreign Application Priority Data

Jan. 12, 2018 (JP) .............................. JP2018-003204

(51) Int. Cl.
*H05K 7/20* (2006.01)
*H01L 23/42* (2006.01)
(Continued)

(52) U.S. Cl.
CPC ........... *H05K 1/0203* (2013.01); *H01L 23/42* (2013.01); *H05K 7/205* (2013.01); *H05K 7/2049* (2013.01);
(Continued)

(58) Field of Classification Search
CPC ........... H05K 7/2039; H05K 7/20445–20454; H05K 7/20472; H05K 7/2049;
(Continued)

(56) References Cited

U.S. PATENT DOCUMENTS 6,798,661 B1 *   9/2004   Barsun ................... H01L 23/467
                                                        165/80.4
9,924,616 B2 *   3/2018   Song ....................... H01L 23/552
(Continued)

FOREIGN PATENT DOCUMENTS

JP     2010-103256 A     5/2010
JP     2010-251634 A     11/2010
(Continued)

OTHER PUBLICATIONS

International Search Report for PCT Application No. PCT/JP2018/045600, dated Mar. 12, 2019.

*Primary Examiner* — Zachary Pape
(74) *Attorney, Agent, or Firm* — Sughrue Mion, PLLC (57) ABSTRACT

This heat dissipation structure includes: a circuit board; an integrated circuit mounted thereon; a first thermal pad disposed on the surface of the integrated circuit; a heat sink having a first surface that applies pressure to the first thermal pad by sandwiching the first thermal pad together with the surface of the integrated circuit and a second surface facing the first surface; a second thermal pad disposed on the second surface; a heat dissipation casing having a surface that applies pressure to the second thermal pad by sandwiching the second thermal pad together with the second surface; and stud components for pulling up the heat sink from the heat dissipation casing side together with the circuit board such that the second thermal pad is sandwiched and pressurized between the heat dissipation casing and the heat sink.

6 Claims, 9 Drawing Sheets

(51) Int. Cl.
*H01L 23/40* (2006.01)
*H05K 1/02* (2006.01)

(52) U.S. Cl.
CPC .. *H05K 7/20472* (2013.01); *H01L 2023/4043* (2013.01); *H01L 2023/4062* (2013.01); *H01L 2023/4068* (2013.01); *H01L 2023/4087* (2013.01); *H05K 7/20454* (2013.01); *H05K 2201/066* (2013.01); *H05K 2201/10409* (2013.01)

(58) Field of Classification Search
CPC ........ H05K 1/0203; H01L 23/40–4006; H01L 2023/4043; H01L 2023/405; H01L 2023/4063; H01L 2023/4068; H01L 2023/4081; H01L 2023/4087
USPC ....... 361/704, 709–710, 719; 165/80.1–80.3; 257/719
See application file for complete search history.

(56) References Cited

U.S. PATENT DOCUMENTS

| | | | |
|---|---|---|---|
| 2003/0210524 A1* | 11/2003 | Berg | H01L 23/42 361/679.54 |
| 2004/0042178 A1* | 3/2004 | Gektin | H01L 23/433 361/705 |
| 2010/0097768 A1* | 4/2010 | Ishii | H05K 7/20454 361/719 |
| 2010/0263851 A1 | 10/2010 | Yasui | |
| 2013/0241046 A1 | 9/2013 | Miyashita | |
| 2014/0239488 A1 | 8/2014 | Kobayashi et al. | |
| 2015/0342023 A1 | 11/2015 | Refai-Ahmed et al. | |

FOREIGN PATENT DOCUMENTS

| | | |
|---|---|---|
| JP | 2014-165231 A | 9/2014 |
| JP | 2015-226058 A | 12/2015 |
| WO | 2012/070463 A1 | 5/2012 |

* cited by examiner

HEAT DISSIPATION STRUCTURE AND HEAT DISSIPATION METHOD

This application is a National Stage Entry of PCT/JP2018/045600 filed on Dec. 12, 2018, which claims priority from Japanese Patent Application 2018-003204 filed on Jan. 12, 2018, the contents of all of which are incorporated herein by reference, in their entirety.

TECHNICAL FIELD

The present invention relates to a heat dissipation structure using a thermal pad for efficiently exhausting heat generated from an integrated circuit to the outside of a casing, and a heat dissipation method.

BACKGROUND ART

In recent electronic devices, various integrated circuits are used. Some of the integrated circuits may require cooling using a heat sink. A typical integrated circuit, which requires cooling using a heat sink, includes a CPU (Central Processing Unit) for a computer. Besides, a GPU (Graphics Processing Unit) and various LSIs (Large Scale Integration) often require cooling.

There are various types of heat dissipation structures for cooling the integrated circuit by using the heat sink. Among those, there is a structure in which a thermal pad is disposed between a surface of the integrated circuit and one surface of the heat sink so as to efficiently conduct heat generated from the integrated circuit to the heat sink. The thermal pad has a characteristic such that moderate compression (pressurization) is required. Unless the compression is appropriately performed, a conduction efficiency of the thermal pad is decreased.

In many cases, the heat generated from the integrated circuit is finally emitted to the outside of a casing. The heat transferred from the integrated circuit to the heat sink is transferred to air (refrigerant) inside the casing by natural air cooling using the heat sink or forced air cooling using a fan. In addition, the heat is transferred from the inside of the casing to the outside of the casing by natural air cooling or forced air cooling. As one example of a structure for emitting the heat generated from the integrated circuit to the outside of the casing as described above, there is a heat dissipation structure using a part of the casing as a heat dissipation plate.

The prior art related to this invention is described, for example, in Patent Literature 1. Patent Literature 1 describes a heat dissipation structure for an integrated circuit. The heat dissipation structure in this literature includes a heat sink disposed on an upper surface of a semiconductor package (integrated circuit) mounted on a circuit board with a thermal sheet sandwiched therebetween, and a reinforcing plate (back plate) provided on a lower surface of the circuit board and having a part for pressing the circuit board.

PRIOR ART LITERATURE(S)

Patent Literature 1: JP 2014-165231 A

SUMMARY OF THE INVENTION

Problem to be Solved by the Invention

In the meanwhile, in an electronic device using a part of a casing as a heat dissipation casing, heat generated from an integrated circuit is thermally conducted to the casing and the heat is emitted to the outside of the casing with air outside the casing used as a refrigerant. With this dissipation structure, it is possible to perform heat dissipation in a sealed state without piercing the casing. Thus, there is an advantage that the casing is easily given dustproof, moisture-proof, and waterproof properties.

Figure 9:
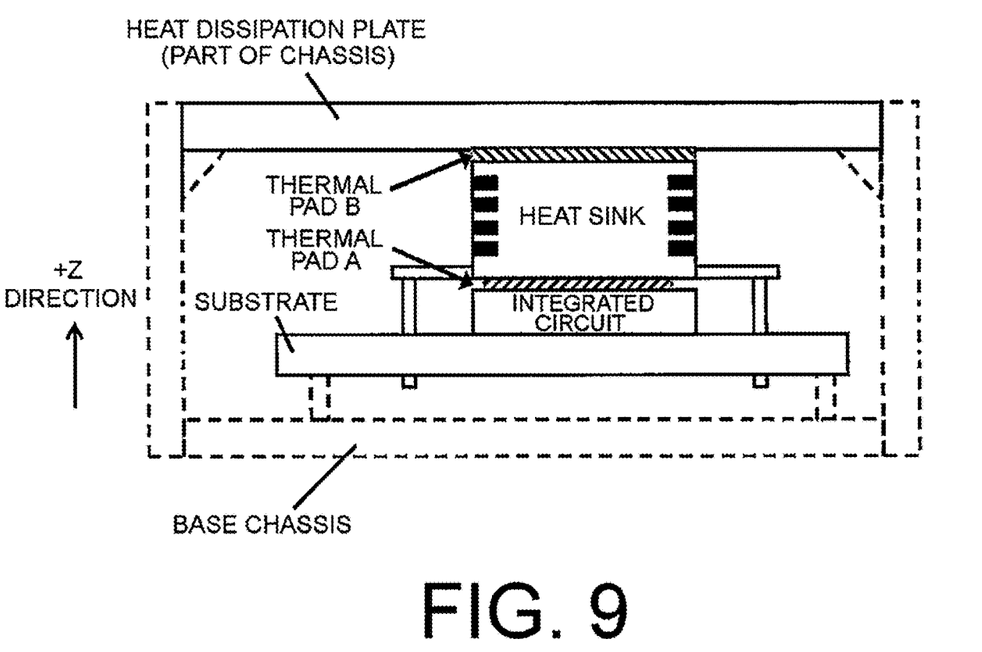
FIG. 9 is an explanatory diagram for illustrating one example of a heat dissipation structure.

FIG. 9 shows one example of the heat dissipation structure for an electronic device, which uses a part of the casing as the heat dissipation casing. The heat dissipation structure illustrated in FIG. 9 is a structure obtained by stacking a circuit board, an integrated circuit, a thermal pad A, a heat sink, a thermal pad B, and a heat dissipation casing in this order.

In the heat dissipation structure, the thermal pads are sandwiched between the heat sink and the integrated circuit and between the heat sink and the heat dissipation casing, respectively, and the respective thermal pads are pressurized.

The heat sink is often fixed to the circuit board through a screw or a spring member. In FIG. 9, the heat sink comprises a plate disposed at one end on the side of the integrated circuit to be parallel to the circuit board and having a plurality of holes, and is fixed to the circuit board via studs inserted through the holes in the plate, respectively. Such fixation of the heat sink using the studs is appropriately carried out on the basis of a size and an elasticity of each member and an amount of pressurization (amount of compression) to the thermal pad A disposed between the integrated circuit and the heat sink. Other than the illustrated example, there is a method of fixing the heat sink to the circuit board by using a structure in which a spring is sandwiched between the studs and the plate or a structure in which the integrated circuit is provided with a socket and the heat sink is embedded therein.

In the heat dissipation structure illustrated in FIG. 9, the thermal pad B is sandwiched between the heat dissipation casing and the heat sink and the heat dissipation casing is pressed against the heat sink to bring the thermal pad B into a pressurized state.

In the above-mentioned heat dissipation structure, the two thermal pads are used. Each thermal pad requires moderate compression (pressurization), for example, a compression rate of 30 to 50% in order to assure its performance.

Generally, the thermal pad A on a lower side of the above-mentioned heat dissipation structure is easily compressed more appropriately under a pressure by the integrated circuit (circuit board) and the heat sink. Presumably, this is because a distance between the integrated circuit (circuit board) and the heat sink is small and the number of components interposed between the circuit board and the heat sink is small.

On the other hand, the thermal pad B on an upper side of the heat dissipation structure is, in many cases, not optimally compressed because the pressure by the heat sink and the heat dissipation casing is not appropriately applied to the thermal pad.

According to one observation by the inventor, there is a problem in the structure for fixing the heat dissipation casing to a base casing.

When the heat dissipation casing is fixed to the base casing by screwing or the like, the thermal pad B is compressed with the base casing as a supporting base whereas the circuit board and the base casing are also applied with a pressure in a −Z direction in the figure. Therefore, deflection in the −Z direction occurs in the circuit board and the base casing. As a result, there is a problem of decrease in pressure for compressing the thermal pad B. Furthermore, in case where a stronger pressure is applied, there may arise a problem that pressurization to the thermal pad A on the lower side becomes stronger than necessary.

As a problem in another aspect, very strict management is required for manufacturing tolerance and/or assembling tolerance in size of each component in the ±Z directions. For example, when the manufacturing tolerance or the assembling tolerance of the respective components is increased as a whole in the −Z direction, the amount of compression of the thermal pad is reduced. When the manufacturing tolerance or the assembling tolerance of the respective components is increased as a whole in the +Z direction, the amount of compression of the thermal pad is increased. Assuming that the tolerance as a whole is very large in the −Z direction, the thermal pad B is not deformed at all.

In the heat dissipation structure described in Patent Literature 1, no description is made of the heat dissipation structure in which the thermal pads are disposed on the upper and the lower sides of the heat sink, respectively, to dissipate the heat generated from the integrated circuit to the outside of an apparatus.

This invention has been made in view of the above-mentioned problems and provides a heat dissipation structure having an excellent heat dissipation performance for an integrated circuit by appropriately pressurizing both of thermal pads disposed on upper and lower sides of a heat sink, and a heat dissipation method.

Means to Solve the Problems

A heat dissipation structure according to one embodiment of this invention comprises a circuit board, an integrated circuit disposed on the circuit board, a first thermal pad disposed on a surface of the circuit board, a heat sink having a first surface for pressing the first thermal pad between the first surface and the surface of the integrated circuit, and a second surface opposite to the first surface, a second thermal pad disposed on the second surface of the heat sink, a heat dissipation casing having a surface for pressing the second thermal pad between the surface and the second surface of the heat sink, and a plurality of sets of stud components configured to pull up the heat sink, together with the circuit board, from the side of the heat dissipation casing into a state where the second thermal pad is sandwiched and pressurized between the heat dissipation casing and the heat sink.

A heat dissipation method according to one embodiment of this invention comprises stacking one on another a circuit board, an integrated circuit attached on the circuit board, a first thermal pad disposed on a surface of the integrated circuit, a heat sink having a first surface for pressing the first thermal pad between the surface of the integrated circuit and the first surface, and a second surface opposite to the first surface, a second thermal pad disposed on the second surface of the heat sink, and a heat dissipation casing having a surface for pressing the second thermal pad between the surface and the second surface of the heat sink, fixing the circuit board and the heat dissipation casing by a base casing being in conformity with the sizes of the integrated circuit, the first thermal pad, the heat sink, and the second thermal pad, and pulling up the heat sink, together with the circuit board, from the side of the heat dissipation casing using a plurality of sets of stud components into a state where the second thermal pad is sandwiched and pressurized between the heat dissipation casing and the heat sink, thereby transferring heat generated from the integrated circuit to the heat dissipation casing to dissipate the heat.

Effect of the Invention

According to this invention, it is possible to provide a heat dissipation structure having an excellent heat dissipation performance for an integrated circuit by appropriately pressurizing both of thermal pads disposed on upper and lower sides of a heat sink, and a heat dissipation method.

MODE FOR EMBODYING THE INVENTION

Embodiments of this invention will be described with reference to the drawings. In the description, a heat dissipation structure will be described using words "upper" and "lower" with reference to an orientation of each figure. However, any direction in the heat dissipation structure may be "upper" when it is incorporated into a real apparatus.

First Embodiment

Figure 1:
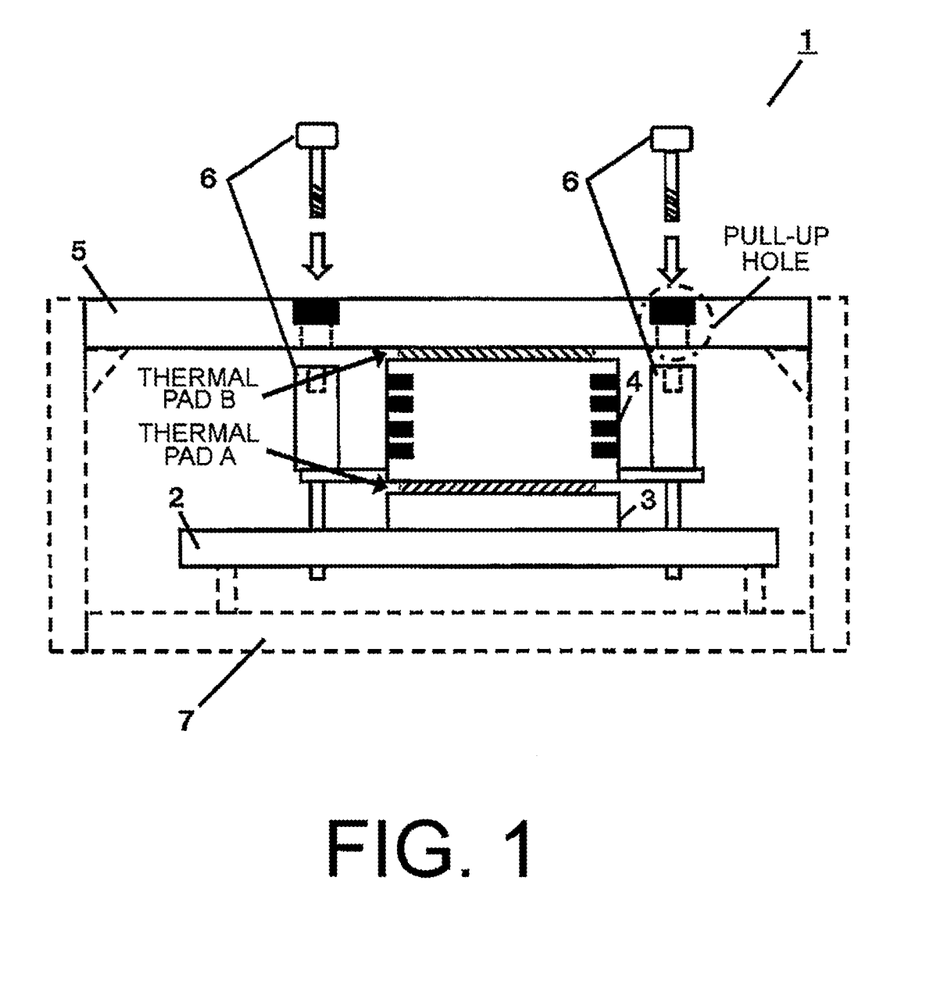
FIG. 1 is a configuration diagram for illustrating an overview of a heat dissipation structure 1 according to a first embodiment of this invention.
Figure 2A:
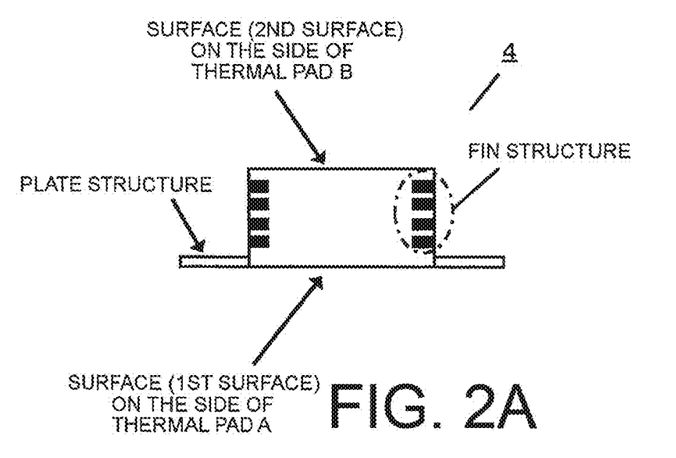
FIGS. 2A, 2B, and 2C are explanatory diagrams for illustrating an overview of a heat sink 4 included in the heat dissipation structure 1 according to this invention.
Figure 2B:
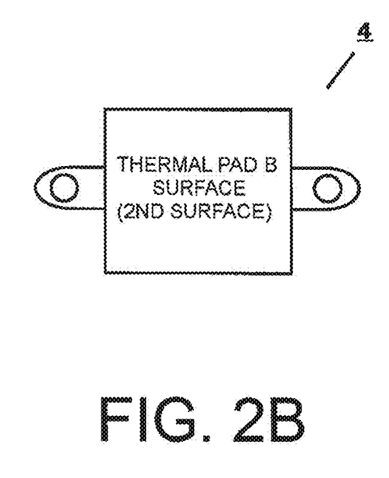
Figure 2C:
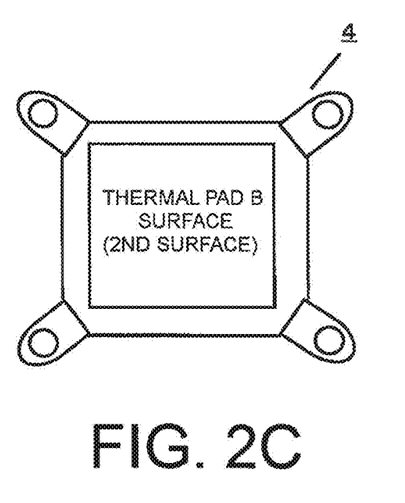
Figure 3A:
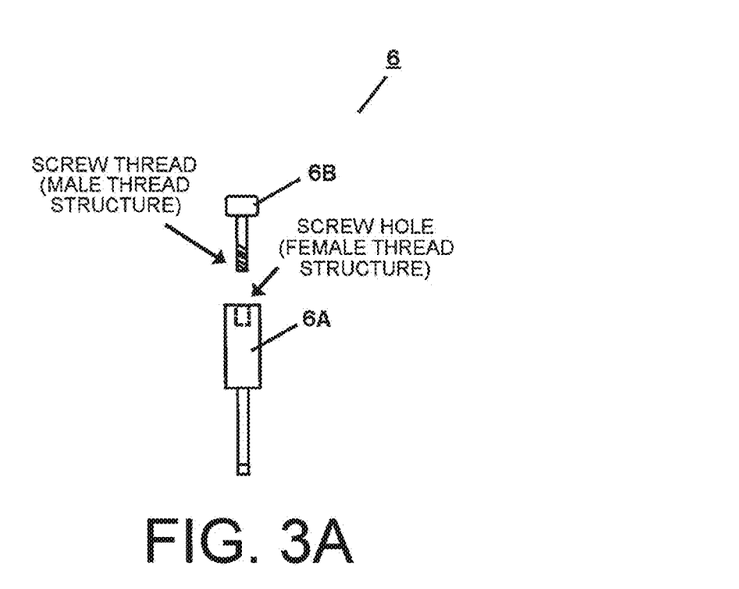
FIGS. 3A and 3B are explanatory diagrams for illustrating structural examples of a stud component 6 included in the heat dissipation structure 1 according to this invention.
Figure 3B:
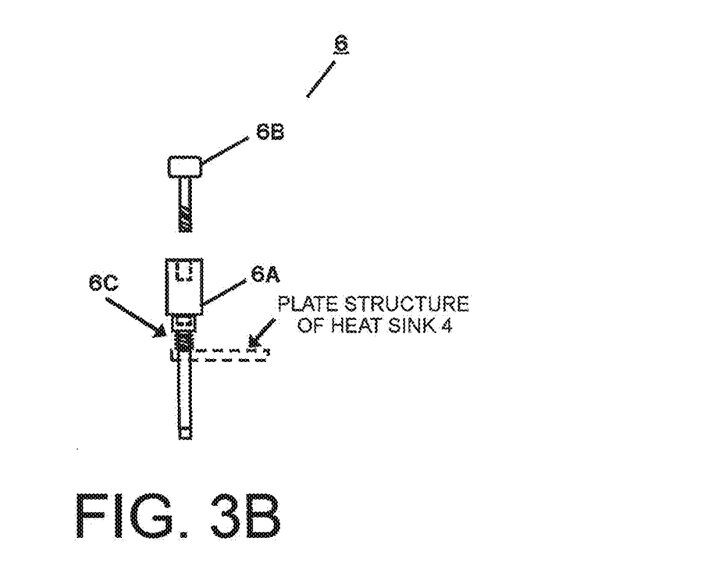

FIG. 1 is an explanatory diagram for illustrating an overview of a heat dissipation structure 1 according to a first embodiment. FIGS. 2A, 2B, and 2C are explanatory diagrams for illustrating an overview of a heat sink 4 included in the heat dissipation structure 1. FIG. 2A is a side view for illustrating an overview of the heat sink 4. FIG. 2B and FIG. 2C are top views for illustrating overviews of the heat sinks 4 having different forms, respectively. FIGS. 3A and 3B are explanatory diagrams for illustrating a stud component 6 included in the heat dissipation structure 1. FIG. 3A and FIG. 3B are side views for illustrating overviews of the stud components 6 having different forms, respectively.

In FIG. 1, the heat dissipation structure comprising a circuit board 2, an integrated circuit 3, a thermal pad A, the heat sink 4, a thermal pad B, a heat dissipation casing 5, and a plurality of sets of the stud components 6 is illustrated. The heat dissipation structure 1 is incorporated into a base casing 7 to dissipate heat generated from the integrated circuit 3 to the outside of the casings.

In the heat dissipation structure 1, the thermal pads (thermal pads A and B) respectively disposed on two surfaces of the heat sink 4 are subjected to appropriate compression, respectively.

Hereinafter, details of the heat dissipation structure 1 will be described focusing on the thermal pads A and B.

The circuit board 2 of the heat dissipation structure 1 is a PCB (Printed Circuit Board) to which the integrated circuit 3 is mounted. The circuit board 2 is, for example, a main board of an apparatus. The integrated circuit 3 is a heat-generation element, such as a CPU, a GPU, and an LSI, which is mounted to the circuit board 2 and which is required to be cooled. Although the integrated circuit 3 is connected to the circuit board 2 by surface-mounting in FIG. 1, a mode of connection is not particularly limited. For example, the integrated circuit 3 may be connected to the circuit board 2 via a LGA (Land Grid Array), a BGA (Ball Grid Array), or an adapter.

As shown in FIG. 1 and FIG. 2A, the heat sink 4 with the thermal pads (A and B) disposed on its both sides faced to the integrated circuit 3 and to the heat dissipation casing 5, respectively, serves as a part of a heat conduction path between the integrated circuit 3 and the heat dissipation casing 5. The heat sink 4 has a first surface and a second surface which are opposite to each other and which press the thermal pad A and the thermal pad B, respectively. The shape of the heat sink 4 is not particularly limited except that the heat sink has the two surfaces brought into contact with the thermal pads A and B. For instance, a fin structure of the heat sink 4 and an area (volume) thereof with respect to the integrated circuit 3 illustrated in FIG. 1 and so on are merely one example. For instance, the heat sink 4 may have a structure adapted to be equipped with a fan or a heat pipe. Similarly, a connection structure (plate structure illustrated in FIGS. 2A, 2B, and 2C) between the heat sink 4 and the stud components 6 illustrated in the figure is not particularly limited. For instance, as illustrated in FIG. 2B, the connection structure may be a structure in which two sets of the stud components 6 are disposed at centers of two surfaces of the heat sink 4, respectively. Furthermore, a structure in which the two sets of the stud components 6 are disposed on a diagonal line of the heat sink 4 may be used. Still further, as illustrated in FIG. 2C, a structure in which four sets of the stud components 6 are disposed at four corners of the heat sink 4 may be used. If the heat sink 4 is large, a structure using a greater number of sets of the stud components 6 may be used.

The thermal pad A (thermal pad on a lower side in the figure) is sandwiched between a surface of the integrated circuit 3 and the first surface of the heat sink 4 to serve as a part of the heat conduction path between the integrated circuit 3 and the heat dissipation casing 5. The thermal pad A is maintained in a state compressed by the surface of the integrated circuit 3 and the first surface of the heat sink 4. Compression of the thermal pad A is carried out by fixing the heat sink 4 to the circuit board 2 by the plurality of sets of the stud components 6. The fixing structure is not particularly limited. For example, the size of each member and a connection torque may be determined in conformity with the shapes of the integrated circuit 3 and the heat sink 4, a predetermined compression rate of the thermal pad A, tolerances, and so on.

The thermal pad B (thermal pad on an upper side in the figure) is sandwiched between a surface of the heat dissipation casing 5 and the second surface of the heat sink 4 to serve as a part of the heat conduction path between the integrated circuit 3 and the heat dissipation casing 5. The thermal pad B is maintained in a state compressed by the surface of the heat dissipation casing 5 and the second surface of the heat sink 4. Compression of the thermal pad B is carried out by pulling up the heat sink 4 together with the circuit board 2 by the plurality of sets of the stud components 6. The amount of pulling up the circuit board 2 (amount of compression of the thermal pad B by the heat sink 4) may be adjusted in conformity with a predetermined compression rate of the thermal pad B, tolerances, and so on.

The heat dissipation casing 5 is a structure for releasing the heat generated from the integrated circuit 3 to the outside of the casing. The heat dissipation casing 5, together with the base casing 7, serves as a part of the casing. In the heat dissipation casing 5, pull-up holes, equal in number to the sets of the stud component 6, are formed to insert the stud components 6 therethrough. Each pull-up hole may have a counterbore as illustrated in FIG. 1 and may not have the counterbore. Although the material and the shape are not particularly limited, it is desirable that the heat dissipation casing 5 is made of a material having a high heat conductivity and has a slit or a fin-like shape so as to improve a heat dissipation characteristic. Connection between the heat dissipation casing 5 and the base casing 7 is not particularly limited and, for example, screwing or adhesive bonding may appropriately be used. The heat dissipation casing 5 and the base casing 7 need not necessarily be connected and, depending on the shape of the apparatus, may not be connected.

The heat dissipation structure 1 illustrated in FIG. 1 and so on includes the plurality of sets of the stud components 6 in addition to the above-mentioned constituent elements.

As illustrated in FIGS. 1, 3A and 3B, the plurality of sets of the stud components 6 pull up the heat sink 4, together with the circuit board 2, from the side of the heat dissipation casing 5 into a state where the thermal pad B is sandwiched and pressurized between the heat dissipation casing 5 and the heat sink 4.

Each set of the stud components 6 pull up the circuit board 2 by inserting one component through the pull-up hole formed in the heat dissipation casing 5 and tightening the other component. In the stud components 6 illustrated in FIG. 3A one set of the stud components 6 comprise a pull-up member 6A and a pull-up screw 6B. In the stud components 6 illustrated in FIG. 3B, one set of the stud components 6 comprise a pull-up member 6A, a pull-up screw 6B, and a spring 6C. The spring 6C is provided between the plate structure of the heat sink 4 and the pull-up member 6A.

The pull-up member 6A is disposed on the side of a side surface of the heat sink 4 and is pulled up, together with the circuit board 2, by the pull-up screw 6B. In the heat dissipation structure 1, a bottom end of the pull-up member 6A is connected to the circuit board 2 and, therefore, the heat sink 4 and the circuit board 2 are pulled up together by pulling up the pull-up member 6A.

The pull-up screw 6B is inserted through the pull-up hole formed in the heat dissipation casing 5 in a state where a screw head portion is engaged with an exterior of the heat dissipation casing 5, and is tightened to pull up the pull-up member 6A, the circuit board 2, and the heat sink 4 together. In the structure of one set of the stud components 6, two members having an external thread and an internal thread illustrated in FIG. 1 may be replaced by each other. For example, if the member corresponding to the pull-up member 6A inside the casing has an external thread structure, a nut may be used as the member corresponding to the pull-up screw 5B.

In the heat dissipation structure 1 having the above-mentioned structure, the circuit board 2, the integrated circuit 3, the thermal pad A, the heat sink 4, the thermal pad B, and the heat dissipation casing 5 are stacked one on another, and the heat sink 4, together with the circuit board 2, is pulled up from the side of the heat dissipation casing 5 by using the plurality of sets of the stud components 6. By pulling up using the plurality of sets of the stud components 6, the thermal pad B sandwiched between the heat-dissipation casing 5 and the heat sink 4 can be pressurized under a predetermined pressure. In this event, since the integrated circuit 3 and the heat sink 4 are pulled up together with the circuit board 2, only a very little effect is imposed on pressurization to the thermal pad A. As a result, it is expected that the heat dissipation structure 1 exhibits an excellent heat dissipation characteristic at both of the thermal pad A and the thermal pad B when the heat generated from the integrated circuit 3 is transferred to the heat dissipation casing 5 to be dissipated.

By constituting the heat dissipation structure 1 as described above, it is possible to provide a heat dissipation structure having an excellent heat dissipation performance for the integrated circuit 3 by appropriately pressurizing both the thermal pad B and the thermal pad B on an upper side and a lower side of the heat sink 4.

Next, this invention will be described with reference to several embodiments. It is noted that the following embodiments may appropriately be combined.

Second Embodiment

Figure 4:
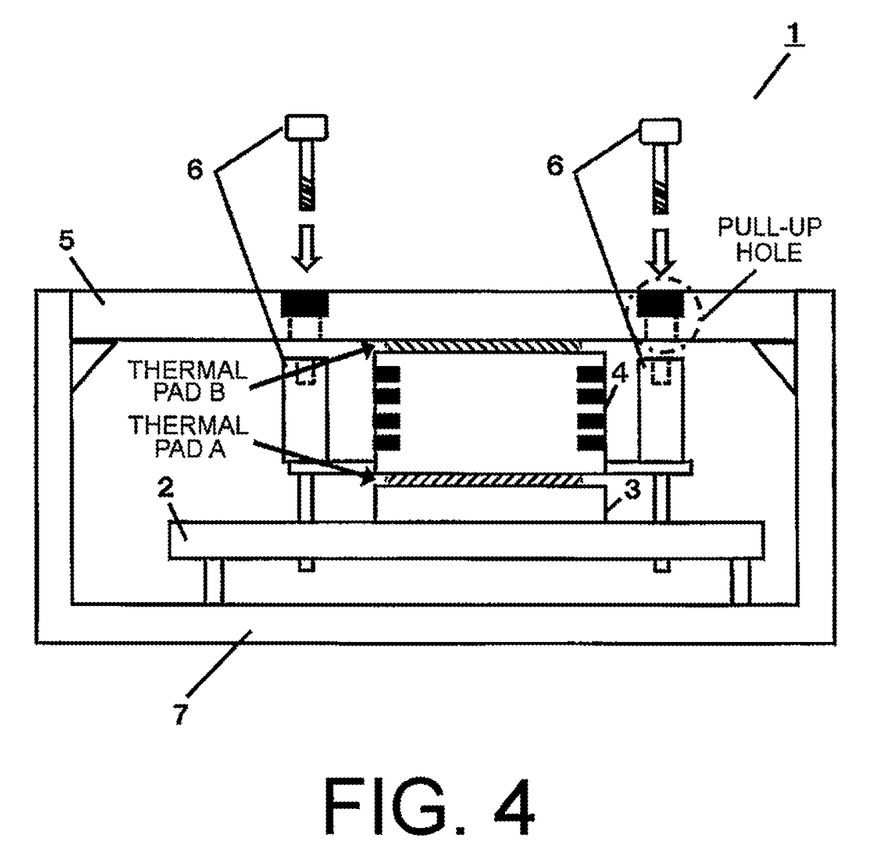
FIG. 4 is a configuration diagram for illustrating an overview of a heat dissipation structure 1 according to a second embodiment of this invention.

FIG. 4 is a configuration diagram for illustrating an overview of a heat dissipation structure 1 according to a second embodiment.

The heat dissipation structure 1 according to the second embodiment is characterized by the base casing 7 and other structures are similar to those of the heat dissipation structure 1 according to the first embodiment.

The base casing 7 according to the second embodiment has a shape adapted to a mode of the apparatus containing the heat dissipation structure 1, and has a structure in which the circuit board 2 and the heat dissipation casing 5 are fixed in conformity with sizes and tolerances of the integrated circuit 3, the thermal pad A, the heat sink 4, and the thermal pad B.

Connection between the heat dissipation casing 5 and the base casing 7 may be carried out, for example, by appropriately using screwing or adhesive bonding and is not particularly limited.

With this configuration, the heat dissipation casing 5 and the base casing 7 are connected and, while the casing is appropriately given functionality, such as a sealed structure or a drip-proof structure, depending on the use of the apparatus, it is possible to provide an excellent heat dissipation performance for the integrated circuit 3 by appropriately pressurizing both the thermal pad A and the thermal pad B.

Third Embodiment

Figure 5A:
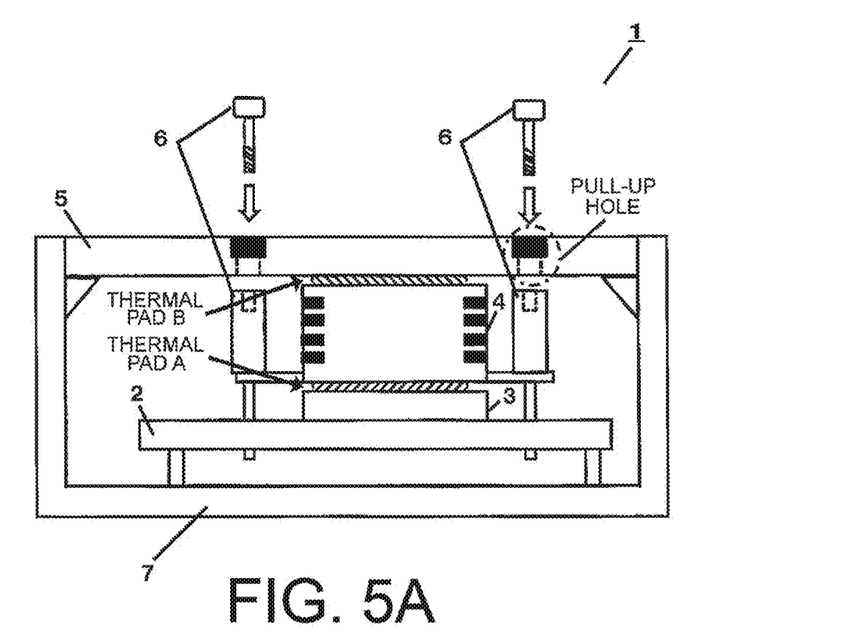
FIGS. 5A, 5B, and 5C are configuration diagrams for illustrating an overview of a heat dissipation structure 1 according to a third embodiment of this invention.
Figure 5B:
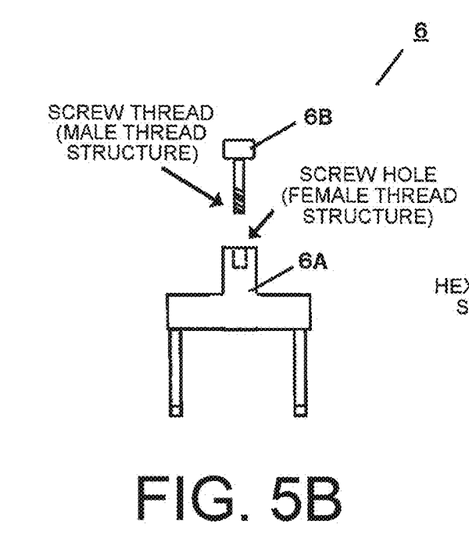
Figure 5C:
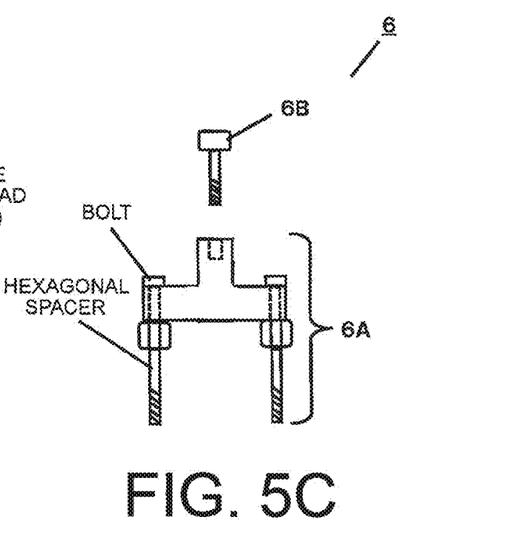

FIGS. 5A, 5B, and 5C are configuration diagrams for illustrating an overview of a heat dissipation structure 1 according to a third embodiment of this invention. FIG. 5B and FIG. 5C are explanatory diagrams for illustrating structural examples of the stud components 6 included in the heat dissipation structure 1 according to the third embodiment. The heat dissipation structure 1 according to the third embodiment is characterized by each set of the stud components 6 (pull-up member 6A) and the other structures are similar to those of the first embodiment and so on.

Each set of the stud components 6 comprise the pull-up member 6A and the pull-up screw 6B. The pull-up member 6A is provided, at one end on the side of the heat dissipation casing 5, with a connection structure with the pull-up screw 6B and, at the other end on the side of the integrated circuit 3, with connection structures inserted through two holes formed at each of four corners of the heat sink 4, respectively.

In the structural example illustrated in FIG. 5B, connecting parts with the circuit board 2 are inserted through a plurality of holes formed in the plate structure of the heat sink 4.

In the structural example illustrated in FIG. 5C, those parts inserted through the plurality of the holes formed in the plate structure of the heat sink 4 comprise further segmentalized components and the connecting parts with the circuit board 2 are inserted.

The pull-up members 6A are disposed on the side of at least two side surfaces of the heat sink 4, respectively, and are pulled up, together with the heat sink 4 and the circuit board 2, from the side of the heat dissipation casing 5 by the pull-up screws 6B. In this event, by using the pull-up member 6A illustrated in FIG. 5B, workability is improved in pressurizing the thermal pad B sandwiched between the heat dissipation casing 5 and the heat sink 4 in a predetermined amount.

On the other hand, by using the pull-up member 6A illustrated in FIG. 5C it is possible to easily execute an operation of pressurizing the thermal pad A sandwiched between the integrated circuit 3 and the heat sink 4 in a predetermined amount before the heat sink 4 is pulled up to compress the thermal pad B. Therefore, as a result, manufacturability of the apparatus may be improved in the structure of the pull-up member illustrated in FIG. 5C than in the structure of the pull-up member illustrated in FIG. 5B.

With the heat dissipation structure 1 having the above-mentioned structure, workability is improved in pressurizing the thermal pad A and the thermal pad B under a predetermined pressure when the heat sink 4, together with the circuit board 2, is pulled up from the side of the heat dissipation casing 5 by using the plurality of sets of the stud components 6.

Fourth Embodiment

Figure 6:
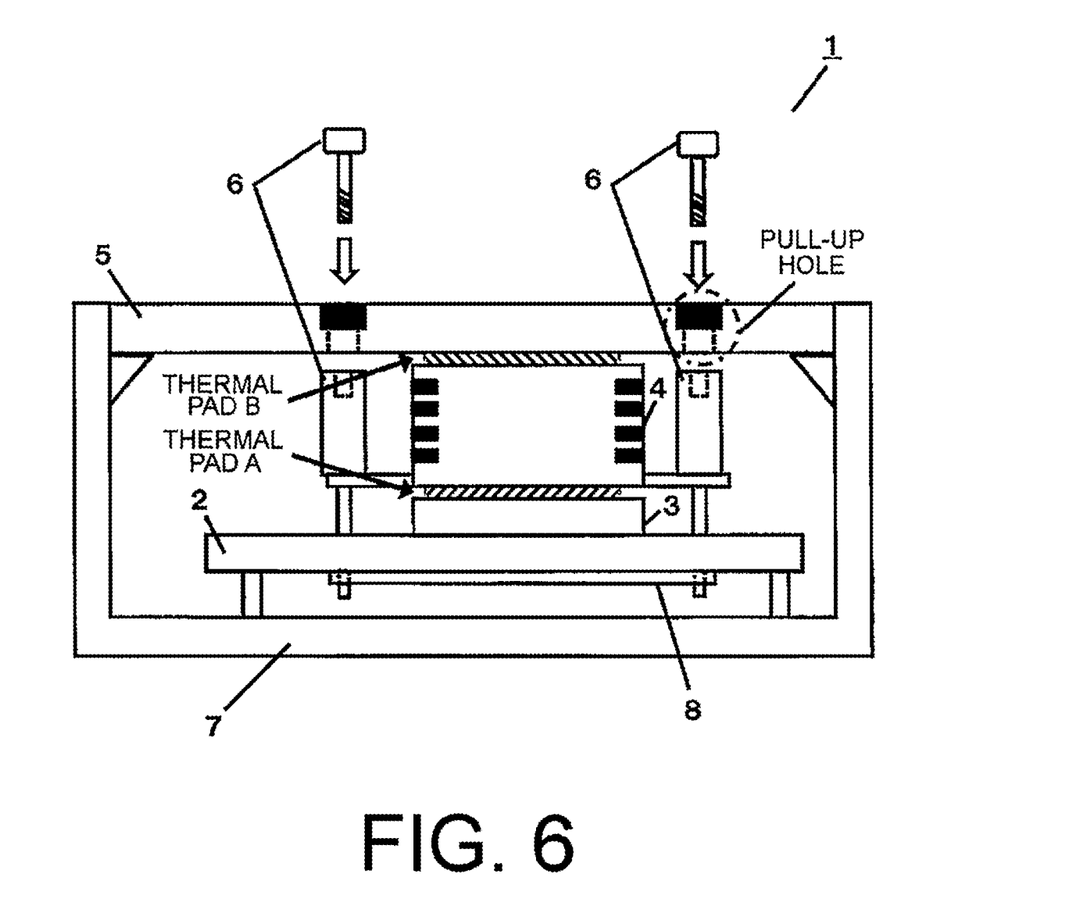
FIG. 6 is a configuration diagram for illustrating an overview of a heat dissipation structure 1 according to a fourth embodiment of this invention.

FIG. 6 is a configuration diagram for illustrating an overview of a heat dissipation structure 1 according to the fourth embodiment.

The heat dissipation structure 1 according to the fourth embodiment is characterized in that a back plate 8 is provided on a back surface of the circuit board 2 and other structures are similar to those of the heat dissipation structure 1 according to the first embodiment and so on.

The back plate 8 is disposed on an opposite surface of the circuit board 2 to a mounting surface to which the integrated circuit 3 is mounted, and has an internal thread structure for the plurality of sets of the stud components 6.

Thus, in the heat dissipation structure 1 according to this embodiment, the back plate 8 is pulled up via the plurality of sets of the stud components 6 when the heat sink 4 is pulled up by tightening the plurality of sets of the stud components 6. By pulling up the back plate 8, the circuit board 2 and the heat sink 4 are pulled up together, with their positional relationship maintained.

With this structure, the back plate 8 is overlapped on the opposite surface of the circuit board 2 to the mounting surface to which the integrated circuit 3 is mounted and, when the stud components 6 are tightened, the heat sink 4 can be pulled up to compress the thermal pad B in a predetermined amount without deflection of the circuit board 2. As a result of no deflection of the circuit board 2, it is possible to easily and appropriately manage the compression rate of the thermal pad A as compared with the heat dissipation structure 1 according to the first embodiment or the like. Furthermore, this structure does not impose an unnecessary stress upon the circuit board 2 (including mounted parts).

Fifth Embodiment

Figure 7:
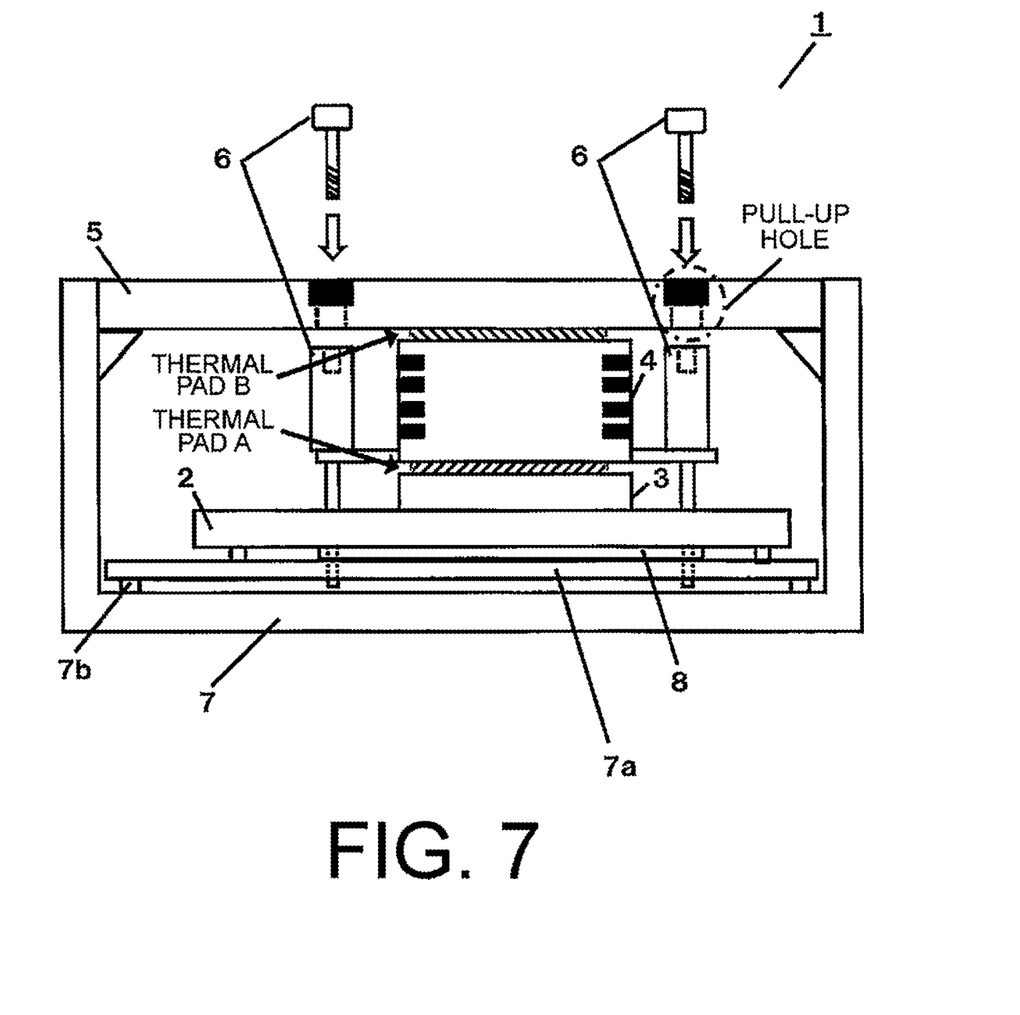
FIG. 7 is a configuration diagram for illustrating an overview of a heat dissipation structure 1 according to a fifth embodiment of this invention.

FIG. 7 is a configuration diagram for illustrating an overview of a heat dissipation structure 1 according to a fifth embodiment of this invention.

The heat dissipation structure 1 according to the fifth embodiment is characterized by comprising a control board tray 7*a* to which the circuit board 2 is mounted and other structures are similar to those of the heat dissipation structure 1 according to the fourth embodiment or the like. This embodiment comprises the back plate 8 on the opposite surface of the circuit board 2 to the mounting surface to which the integrated circuit 3 is mounted. However, the heat dissipation structure 1 may be configured in a mode having the control board tray 7*a* without the back plate 8.

The control board tray 7*a* is connected to the base casing 7 by a plurality of bosses 7*b*, carries the circuit board 2 mounted thereon, and has an internal thread structure for the plurality of sets of the stud components 6.

Thus, the base casing 7 of the heat dissipation structure 1 according to this embodiment comprises the control board tray 7*a* which carries the circuit board 2 mounted thereon and which serves as the internal thread structure for the plurality of sets of the stud components 6. As a result, the heat dissipation structure 1 has a structure in which the control board tray 7*a* is pulled up via the plurality of sets of the stud components 6 when the heat sink 4 is pulled up by tightening the plurality of sets of the stud components 6. By pulling up the control board tray 7*a*, the circuit board 2 and the heat sink 4 are pulled up together, with their positional relationship maintained.

With this structure, the back plate 8 is overlapped on the opposite surface of the circuit board 2 to the mounting surface to which the integrated circuit 3 is mounted, and the circuit board 2 is mounted to the control board tray 7*a* with the back plate 8 overlapped thereon. When the stud components 6 are tightened, the heat sink 4 can be pulled up to compress the thermal pad B in a predetermined amount without deflection of the circuit board 2. As a result of no deflection of the circuit board 2, it is possible to easily and appropriately manage the compression rate of the thermal pad A as compared with the heat dissipation structure 1 according to the first embodiment or the like. Furthermore, this structure does not impose an unnecessary stress upon the circuit board 2 (including mounted parts).

Next, this invention will be described with reference to one configuration example of this invention.

One Configuration Example

Figure 8A:
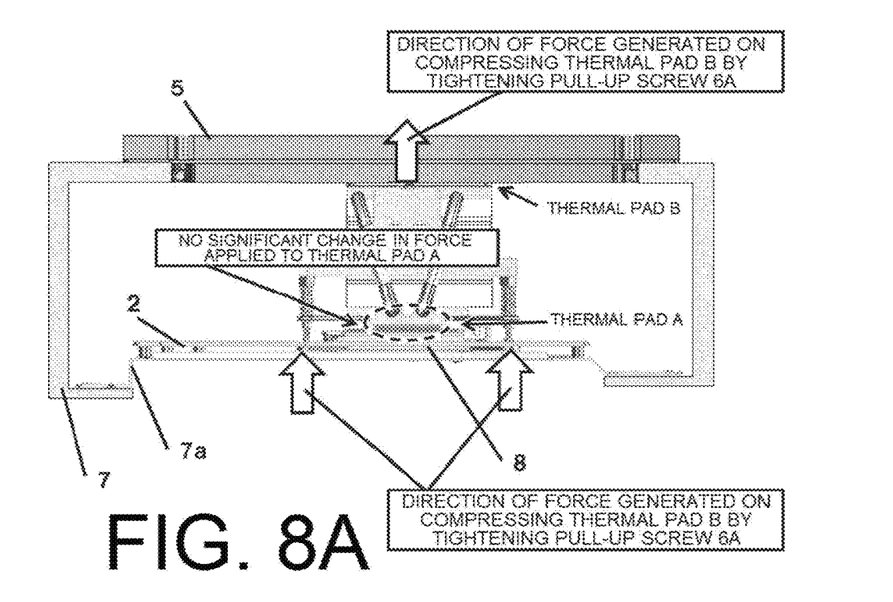
FIGS. 8A and 8B are configuration diagrams for illustrating an overview of a heat dissipation structure 1 of a configuration example according to this invention.
Figure 8B:
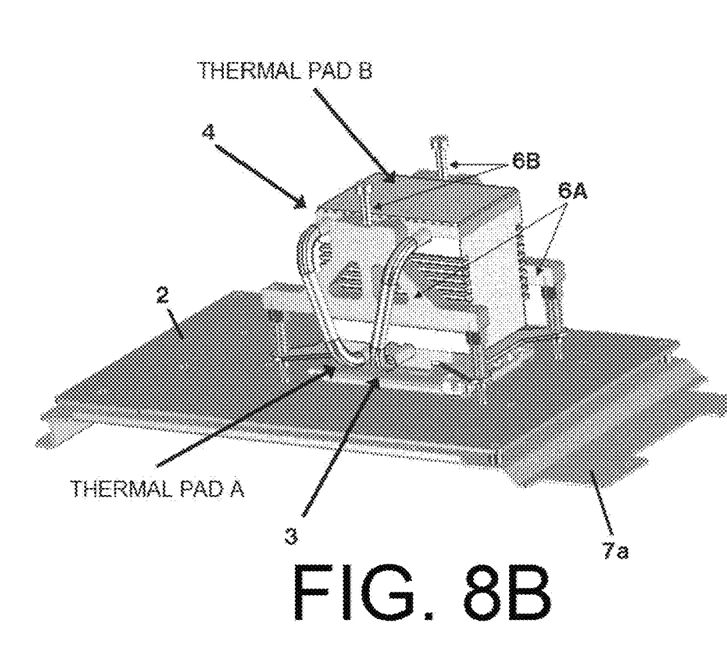

FIGS. 8A and 8B are configuration diagrams for illustrating an overview of a heat dissipation structure 1 of one configuration example. The heat dissipation structure 1 is similar to the heat dissipation structure 1 according to the fourth embodiment. FIG. 8A is a sectional view of an electronic device having the heat dissipation structure 1. FIG. 8B is a perspective view for illustrating some components of the heat dissipation structure 1.

In the heat dissipation structure 1 according to the configuration example, the thermal pad B is compressed by using two sets of the stud components 6 located on a front side and a back side of the heat sink 4 in the figure.

In the figure, the pull-up member 6A is formed of a metal plate. The pull-up member 6A has a lower part having a structure adapted to be connected to the heat sink 4 and to be fixed to the back plate 8. The pull-up member 6A has an upper part having a structure adapted to be engaged via a screw hole with the pull-up screw 6B.

The circuit board 2 is a main board of the electronic device and the integrated circuit 3 is a CPU of the electronic device.

The heat dissipation casing 5 is a cover casing covering a top surface in the figure whereas the base casing 7 (including the control board tray 7*a*) serves as a whole framework and covers side surfaces. The base casing 7 fixes the circuit board 2 and the heat dissipation casing 5 in conformity with the size of the CPU, the size of compression of the thermal pad A, the size of the heat sink, and the size of compression of the thermal pad B. Although not illustrated in the figure, other components of the electronic device are further mounted on a lower side of the control board tray 7*a*.

As illustrated in the figure, as a structural internal configuration of the electronic device, the back plate 8, the circuit board 2, the integrated circuit 3, the thermal pad A, the heat sink 4, the terminal pad B, and the heat dissipation casing 5 are stacked one on another, and the circuit board 2 and the heat dissipation casing 5 are fixed to the base casing 7. The back plate 8 is provided with a structure for receiving the stud components 6.

In order to prevent degradation of the heat dissipation characteristic (heat conductivity) of the integrated circuit 3, the heat dissipation structure 1 is used at a predetermined compression rate so as to assure performances of the thermal pad A and the thermal pad B.

Specifically, the thermal pad A is appropriately compressed by the back plate 8 on the back surface of the circuit board 2 and screws, springs, and the heat sink 4 (its plate) which are connected thereto whereas the thermal pad B is appropriately compressed by tightening the pull-up screws 6B to pull up, via the respective sets of the stud components 6, those constituent elements upper than the back plate 8 in the figure. In this event, no significant change occurs in a force applied to the thermal pad A.

As described above, with the heat dissipation structure, it is possible to provide a heat dissipation method having an excellent heat dissipation performance for the integrated circuit by appropriately pressurizing both of the thermal pads on the upper side and on the lower side of the heat sink.

With reference to the embodiments and the configuration example, this invention has been described. However, specific structures of this invention are not restricted to the embodiments and the configuration example described above. This invention encompasses any modifications which do not deviate from the gist of this invention.

A part or a whole of the above-mentioned embodiments may be described as follows. It is noted that the following Supplementary Notes do not restrict this invention at all.

[Supplementary Note 1]
A heat dissipation structure comprising:
a circuit board:
an integrated circuit disposed on the circuit board;
a first thermal pad disposed on a surface of the circuit board;
a heat sink having a first surface for pressing the first thermal pad between the first surface and the surface of the integrated circuit, and a second surface opposite to the first surface;
a second thermal pad disposed on the second surface of the heat sink,
a heat dissipation casing having a surface for pressing the second thermal pad between the surface and the second surface of the heat sink; and
a plurality of sets of stud components configured to pull up the heat sink, together with the circuit board, from the side of the heat dissipation casing into a state where the second thermal pad is sandwiched and pressurized between the heat dissipation casing and the heat sink.

[Supplementary Note 2]
The heat dissipation structure according to Supplementary Note 1, further comprising:
a base casing configured to fix the circuit board and the heat dissipation casing in conformity with the sizes of the integrated circuit, the first thermal pad, the heat sink, and the second thermal pad;
the plurality of sets of the stud components being configured to pull up the heat sink, together with the circuit board, from the side of the heat dissipation casing while the heat dissipation casing and the base casing are positionally fixed.

[Supplementary Note 3]
The heat dissipation structure according to Supplementary Note 2, wherein:
the heat sink is provided, at one end on the side of the first thermal pad, with a plate structure parallel to the circuit board and having a plurality of holes;
the heat sink being fixed to the circuit board by inserting, through the plurality of the holes formed in the plate structure, the sets of the stud components for pulling up the circuit board from the side of the heat sink.

[Supplementary Note 4]
The heat dissipation structure according to Supplementary Note 3, wherein the stud components comprise:
a plurality of pull-up members disposed on the sides of at least two side surfaces of the heat sink to pull up the heat sink, together with the circuit board, from the side of the heat dissipation casing; and
a plurality of pull-up screws for tightening the plurality of the pull-up members and the heat dissipation casing to pull up the heat sink, together with the pull-up members and the circuit board, from the side of the heat dissipation casing;
each of the plurality of the pull-up members having, at one end on the side of the heat dissipation casing, a connection structure to be connected to the pull-up screw and, at the other end on the side of the integrated circuit, connection structures inserted through the plurality of the holes formed in the plate structure to be connected with stud components.

[Supplementary Note 5]
The heat dissipation structure according to Supplementary Note 4, further comprising:
a back plate formed on an opposite surface of the circuit board to a mounting surface to which the integrated circuit is mounted, and serving as an internal thread structure for the plurality of sets of the stud components;
the heat dissipation structure having a configuration that, when the heat sink is pulled up by tightening the plurality of sets of the stud components, the back plate is pulled up via the plurality of sets of the stud components.

[Supplementary Note 6]
The heat dissipation structure according to Supplementary Note 4, further comprising;
a back plate formed on an opposite surface of the circuit board to a mounting surface to which the integrated circuit is mounted;
the base casing including a control board tray to which the circuit board is mounted and which serves as an internal thread structure for the plurality of sets of the stud components;
the heat dissipation structure having a configuration that, when the heat sink is pulled up by tightening the plurality of sets of the stud components, the control board tray is pulled up, together with the back plate, via the plurality of sets of the stud components.

[Supplementary Note 7]
The heat dissipation structure according to Supplementary Note 5, wherein:
the circuit board is a main board of an electronic device;
the integrated circuit is a CPU;
the heat dissipation casing is a cover casing;
the base casing including a control board tray to which the circuit board is mounted and which serves as an internal thread structure for the plurality of sets of the stud components;
the main board being fixed to the control board tray, the base casing fixing the main board and the cover casing in conformity with the size of the CPU, the size of compression of the first thermal pad, the size of the heat sink, and the size of compression of the second thermal pad.

[Supplementary Note 8]
A heat dissipation method comprising:
stacking one on another:
a circuit board;
an integrated circuit attached on the circuit board;
a first thermal pad disposed on a surface of the integrated circuit;
a heat sink having a first surface for pressing the first thermal pad between the surface of the integrated circuit and the first surface, and a second surface opposite to the first surface;
a second thermal pad disposed on the second surface of the heat sink; and
a heat dissipation casing having a surface for pressing the second thermal pad between the surface and the second surface of the heat sink;
pulling up the heat sink, together with the circuit board, from the side of the heat dissipation casing using a plurality of sets of stud components into a state where the second thermal pad is sandwiched and pressurized between the heat dissipation casing and the heat sink, thereby transferring heat generated from the integrated circuit to the heat dissipation casing to dissipate the heat.

[Supplementary Note 9]
The heat dissipation method according to Supplementary Note 8, further comprising:
fixing the circuit board and the heat dissipation casing by a base casing being in conformity with the sizes of the integrated circuit, the first thermal pad, the heat sink, and the second thermal pad; and
pulling up the heat sink, together with the circuit board, from the side of the heat dissipation casing using a plurality of sets of stud components into a state where the second thermal pad is sandwiched and pressurized between the heat dissipation casing and the heat sink, thereby transferring heat generated from the integrated circuit to the heat dissipation casing to dissipate the heat.

[Supplementary Note 10]

The heat dissipation method according to Supplementary Note 9, further comprising:

overlapping a back plate on an opposite surface of the circuit board to a mounting surface to which the integrated circuit is mounted; and tightening the plurality of sets of the stud components to pull up the back plate, thereby compressing the second thermal pad in a predetermined amount to improve a heat dissipation characteristic.

[Supplementary Note 11]

The heat dissipation method according to Supplementary Note 9, further comprising:

overlapping a back plate on an opposite surface of the circuit board to a mounting surface to which the integrated circuit is mounted;

mounting the circuit board on a control board tray with the back plate overlapped thereon; and tightening the plurality of sets of the stud components to pull up the control board tray, together with the back plate, thereby compressing the second thermal pad in a predetermined amount to improve a heat dissipation characteristic.

[Supplementary Note 12]

The heat dissipation method according to Supplementary Note 10, wherein:

the circuit board is a main board of an electronic device;

the integrated circuit is a CPU;

the heat dissipation casing is a cover casing;

the base casing including a control board tray to which the circuit board is mounted and which serves as an internal thread structure for the plurality of sets of the stud components;

the main board being fixed to the control board tray, the base casing fixing the main board and the cover casing in conformity with the size of the CPU, the size of compression of the first thermal pad, the size of the heat sink, and the size of compression of the second thermal pad.

This invention is suitable for various types of apparatus using natural air cooling and/or closed cooling.

This application is based upon and claims the benefit of priority from Japanese patent application No. 2018-003204, filed on Jan. 12, 2018, the disclosure of which is incorporated herein in its entirety by reference.

EXPLANATION OF REFERENCE SYMBOLS 1 heat dissipation structure
2 circuit board
3 integrated circuit
4 heat sink
5 heat dissipation casing
6 stud component
6A pull-up member
6B pull-up screw
6C spring
7 base casing
7a control board tray
8 back plate
A thermal pad
B thermal pad

What is claimed is:

1. A heat dissipation structure comprising:

a circuit board:

an integrated circuit disposed on the circuit board;

a first thermal pad disposed on a surface of the integrated circuit;

a heat sink having a first surface for pressing the first thermal pad between the first surface and the surface of the integrated circuit, and a second surface opposite to the first surface;

a second thermal pad disposed on the second surface of the heat sink;

a heat dissipation casing having a surface for pressing the second thermal pad between the surface and the second surface of the heat sink;

a plurality of sets of stud components configured to pull up the heat sink, together with the circuit board, from the side of the heat dissipation casing into a state where the second thermal pad is sandwiched and pressurized between the heat dissipation casing and the heat sink;

a base casing configured to fix the circuit board and the heat dissipation casing in conformity with the sizes of the integrated circuit, the first thermal pad, the heat sink, and the second thermal pad;

the plurality of sets of the stud components being configured to pull up the heat sink, together with the circuit board, from the side of the heat dissipation casing while the heat dissipation casing and the base casing are positionally fixed; and the heat sink is provided, at one end on the side of the first thermal pad, with a plate parallel to the circuit board and having a plurality of holes;

the heat sink being fixed to the circuit board by inserting, through the plurality of the holes formed in the plate, the sets of the stud components for pulling up the circuit board from the side of the heat sink.

2. The heat dissipation structure according to claim 1, wherein the stud components comprise:

a plurality of pull-up members disposed on the sides of at least two side surfaces of the heat sink to pull up the heat sink, together with the circuit board, from the side of the heat dissipation casing; and a plurality of pull-up screws for tightening the plurality of the pull-up members and the heat dissipation casing to pull up the heat sink, together with the pull-up members and the circuit board, from the side of the heat dissipation casing;

each of the plurality of the pull-up members having, at one end on the side of the heat dissipation casing, a connection structure to be connected to the pull-up screw and, at the other end on the side of the integrated circuit, connection structures inserted through the plurality of the holes formed in the plate to be connected with the stud components.

3. The heat dissipation structure according to claim 2, further comprising:

a back plate formed on an opposite surface of the circuit board to a mounting surface to which the integrated circuit is mounted, and serving as an internal thread structure for the plurality of sets of the stud components;

the heat dissipation structure having a configuration that, when the heat sink is pulled up by tightening the plurality of sets of the stud components, the back plate is pulled up via the plurality of sets of the stud components.

4. The heat dissipation structure according to claim 2, further comprising;
- a back plate formed on an opposite surface of the circuit board to a mounting surface to which the integrated circuit is mounted;
- the base casing including a control board tray to which the circuit board is mounted and which serves as an internal thread structure for the plurality of sets of the stud components;
- the heat dissipation structure having a configuration that, when the heat sink is pulled up by tightening the plurality of sets of the stud components, the control board tray is pulled up, together with the back plate, via the plurality of sets of the stud components.

5. The heat dissipation structure according to claim 3, wherein:
- the circuit board is a main board of an electronic device;
- the integrated circuit is a CPU;
- the heat dissipation casing is a cover casing;
- the base casing including a control board tray to which the circuit board is mounted and which serves as an internal thread structure for the plurality of sets of the stud components;
- the main board being fixed to the control board tray, the base casing fixing the main board and the cover casing via the control board tray in conformity with the thickness of the CPU, the size of compression of the first thermal pad, the thickness of the heat sink, and the size of compression of the second thermal pad.

6. A heat dissipation method comprising:
stacking one on another:
- a circuit board;
- an integrated circuit attached on the circuit board;
- a first thermal pad disposed on a surface of the integrated circuit;
- a heat sink having a first surface for pressing the first thermal pad between the surface of the integrated circuit and the first surface, and a second surface opposite to the first surface;
- a second thermal pad disposed on the second surface of the heat sink; and
- a heat dissipation casing having a surface for pressing the second thermal pad between the surface and the second surface of the heat sink;

overlapping a back plate on an opposite surface of the circuit board to a mounting surface to which the integrated circuit is mounted;

mounting the circuit board on a control board tray with the back plate overlapped thereon;

fixing the circuit board and the heat dissipation casing by a base casing being in conformity with the sizes of the integrated circuit, the first thermal pad, the heat sink, and the second thermal pad;

pulling up the heat sink, together with the circuit board, from the side of the heat dissipation casing using a plurality of sets of stud components into a state where the second thermal pad is sandwiched and pressurized between the heat dissipation casing and the heat sink, thereby transferring heat generated from the integrated circuit to the heat dissipation casing to dissipate the heat.

* * * * *